(12) United States Patent
Hsu

(10) Patent No.: US 7,040,389 B2
(45) Date of Patent: May 9, 2006

(54) INTEGRATED HEAT DISSIPATION APPARATUS

(76) Inventor: Hul-Chun Hsu, 6F-3, No. 422, Sec. 2, Li-Ming Rd., Taichung (TW)

( * ) Notice: Subject to any disclaimer, the term of this patent is extended or adjusted under 35 U.S.C. 154(b) by 155 days.

(21) Appl. No.: 10/843,626

(22) Filed: May 12, 2004

(65) Prior Publication Data

US 2005/0252650 A1    Nov. 17, 2005

(51) Int. Cl.
*H05K 7/20* (2006.01)

(52) U.S. Cl. .................... 165/185; 165/80.3; 174/16.3; 257/722; 361/697; 361/704

(58) Field of Classification Search ............... 165/80.3, 165/185; 174/16.3; 257/722; 361/697, 361/704
See application file for complete search history.

(56) References Cited

U.S. PATENT DOCUMENTS

| | | | |
|---|---|---|---|
| 6,816,373 B1 * | 11/2004 | Lee et al. | 361/697 |
| 6,860,321 B1 * | 3/2005 | Ji-Hai et al. | 165/80.3 |
| 6,924,982 B1 * | 8/2005 | Chen et al. | 361/697 |
| 2002/0020517 A1 * | 2/2002 | Hsu | 165/80.3 |
| 2003/0209342 A1 * | 11/2003 | Hsin et al. | 165/80.3 |
| 2005/0111190 A1 * | 5/2005 | Wang et al. | 361/704 |

* cited by examiner

*Primary Examiner*—Leonard R. Leo

(57) ABSTRACT

An integrated heat dissipation apparatus includes a thermal conductor base and a heat sink interlocked with each other. The thermal conductor base has a channel formed in an upper portion thereof and a pair of grooves formed on two opposing elongate sidewalls thereof. The channel extends through the thermal conductor base along an elongate direction thereof. The grooves extending between two opposing ends of the thermal conductor base are proximal to bottom edges of the sidewalls. The heat sink has a bottom surface recessed to form a receiving slot conformal to the upper portion of the thermal conductor base. The receiving slot has a pair of protrusions extending along two elongate bottom edges of the receiving slot between two opposing ends of the heat sink.

13 Claims, 8 Drawing Sheets

INTEGRATED HEAT DISSIPATION APPARATUS

BACKGROUND OF THE INVENTION

The present invention relates in general to an integrated heat dissipation apparatus, and more particularly, to a heat dissipation apparatus used in a central processing unit of a computer or a heat generating device. The heat dissipation apparatus includes a thermal conductive base and a heat sink interlocked with each other to increase the contact density between components, so as to enhance the thermal conducting performance.

Thermal conductors are very suitable for use in computers for dissipating heat generated by various components thereof. The products of thermal conductors such as heat pipes or copper columns used have the characteristics of high thermal transmission, fast thermal conduction, light weight, simple structure and versatile application. Therefore, a signification amount of heat can be transmitted without consuming excessive power. This type of heat dissipation apparatus is thus very suitable for use in electronic products. It is thus a very important topic for combining the heat conductor and the heat sink into an integrated heat dissipation apparatus to efficiently dissipate heat generated from an electronic heat source.

FIG. 1 shows a conventional combined heat dissipation apparatus including a thermal conductive base 10a, two heat pipes 20a and a heat sink 30a. The bottom surface of the thermal conductive base 10a is attached to a top surface of a central processing unit (CPU). The top surface of the thermal conductive base 10a includes two grooves 11a allowing one side of the heat pipes 20a embedded therein. The heat pipes 20a have first sides extending through the heat sink 30a and second sides extending through the heat sink 30a. The heat sink 30a typically has a plurality of fins stacked with each other, and a hole 32a is formed in each fin allowing the second sides of the heat pipes 20a to extend through. Thermal conductive medium is applied to the joints of the above components, including the grooves 11a, the peripheries of holes 32, and the side surfaces of the heat pipes 20a.

The above heat dissipation apparatus has the following drawbacks.

Firstly, each heat pipe 20a include a cylindrical member with a small gauge, such that the wick structure and the working fluid installed in the heat pipe 20a is strictly limited by the available space of the heat pipe 20a. Further, as the contact area between the thermal conductive base 10a and the heat sink 30 is very small, the thermal resistance is large. Therefore, the thermal energy to be dissipated is very limited.

Secondly, the holes 32a extending through the fins 31a include closed circular apertures. The thermal conductive adhesive can hardly be applied to the peripheries of the holes 32a evenly. Therefore, a good contact cannot be achieved.

Thirdly, the air circulation channels between the fins 31a does not have streamline configuration. When the fan blows an air downward to the heat sink 30a, turbulence is easily caused to cause large resistance, large noise, turbulences and low thermal convection coefficient.

To resolve the problems caused by the conventional heat dissipation apparatus as described above, with many years of experience in this field, an integrated heat dissipation apparatus has been developed as described as follows.

SUMMARY OF THE INVENTION

The present invention provides an integrated heat dissipation apparatus including a thermal conductor base and a heat sink interlocked with each other, such that contact density and thermal resistance between the thermal conductor base and the heat sink are greatly reduced. Further, thermal conductive medium or adhesive can be evenly applied on the contact areas and the receiving slots, such that a heat dissipation structure having a low thermal resistance is provided.

The integrated heat dissipation apparatus provided by the present invention comprises a thermal conductor base and a heat sink. The thermal conductor base includes a channel formed in an upper portion thereof and a pair of grooves formed on two opposing elongate sidewalls thereof. The channel extends through the thermal conductor base along an elongate direction thereof. The grooves extend between two opposing ends of the thermal conductor base and are proximal to bottom edges of the sidewalls. The heat sink has a bottom surface recessed to form a receiving slot conformal to the upper portion of the thermal conductor base. The receiving slot includes a pair of protrusions extending along two elongate bottom edges of the receiving slot between two opposing ends of the heat sink.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF ACCOMPANIED DRAWINGS

The above objects and advantages of the present invention will be become more apparent by describing in detail exemplary embodiments thereof with reference to the attached drawings in which.

Figure 4:
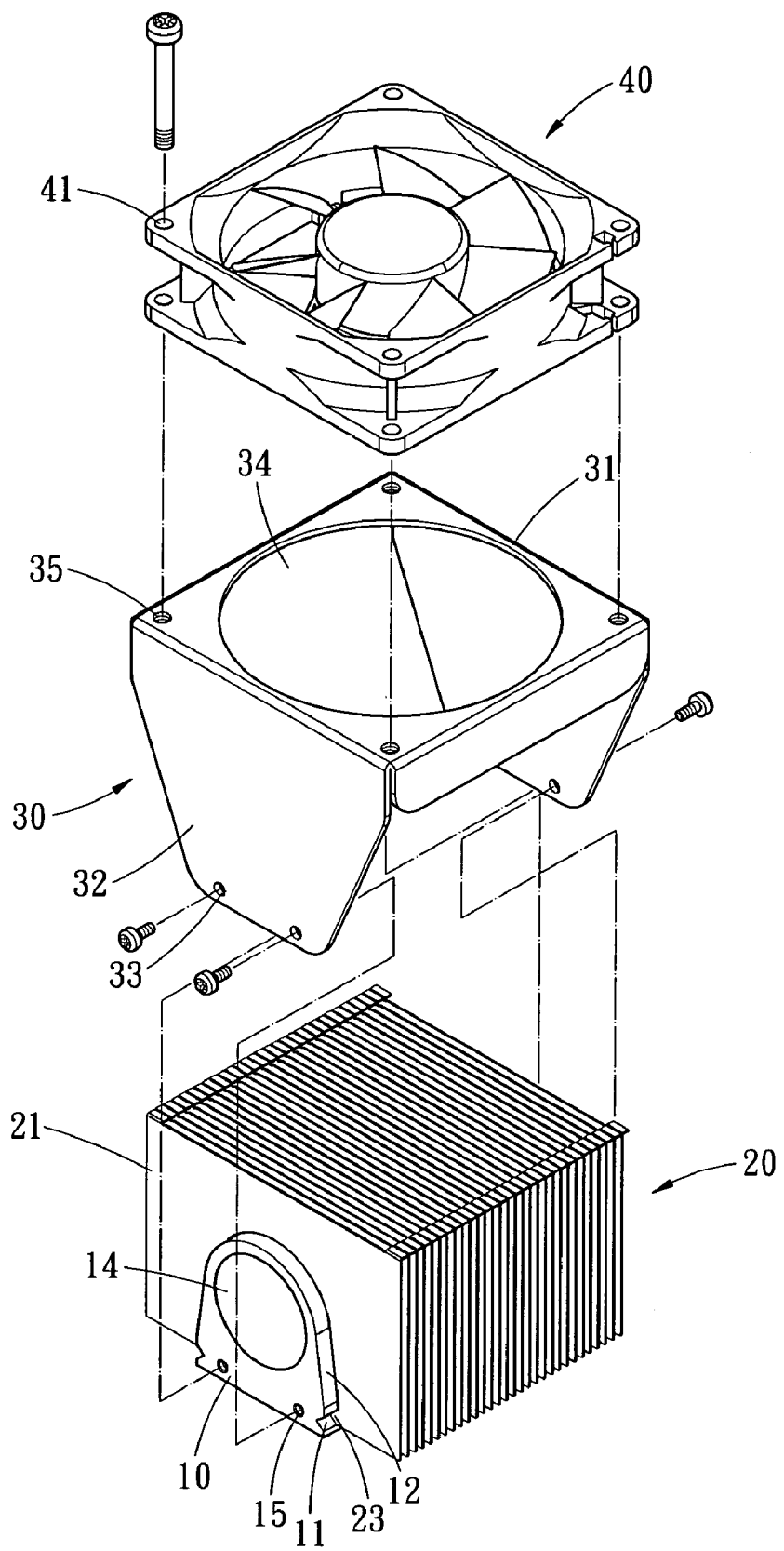
FIG. 4 shows an exploded view of a system comprising the heat dissipation apparatus as shown in FIG. 2, a holder and a fan.
Figure 5:
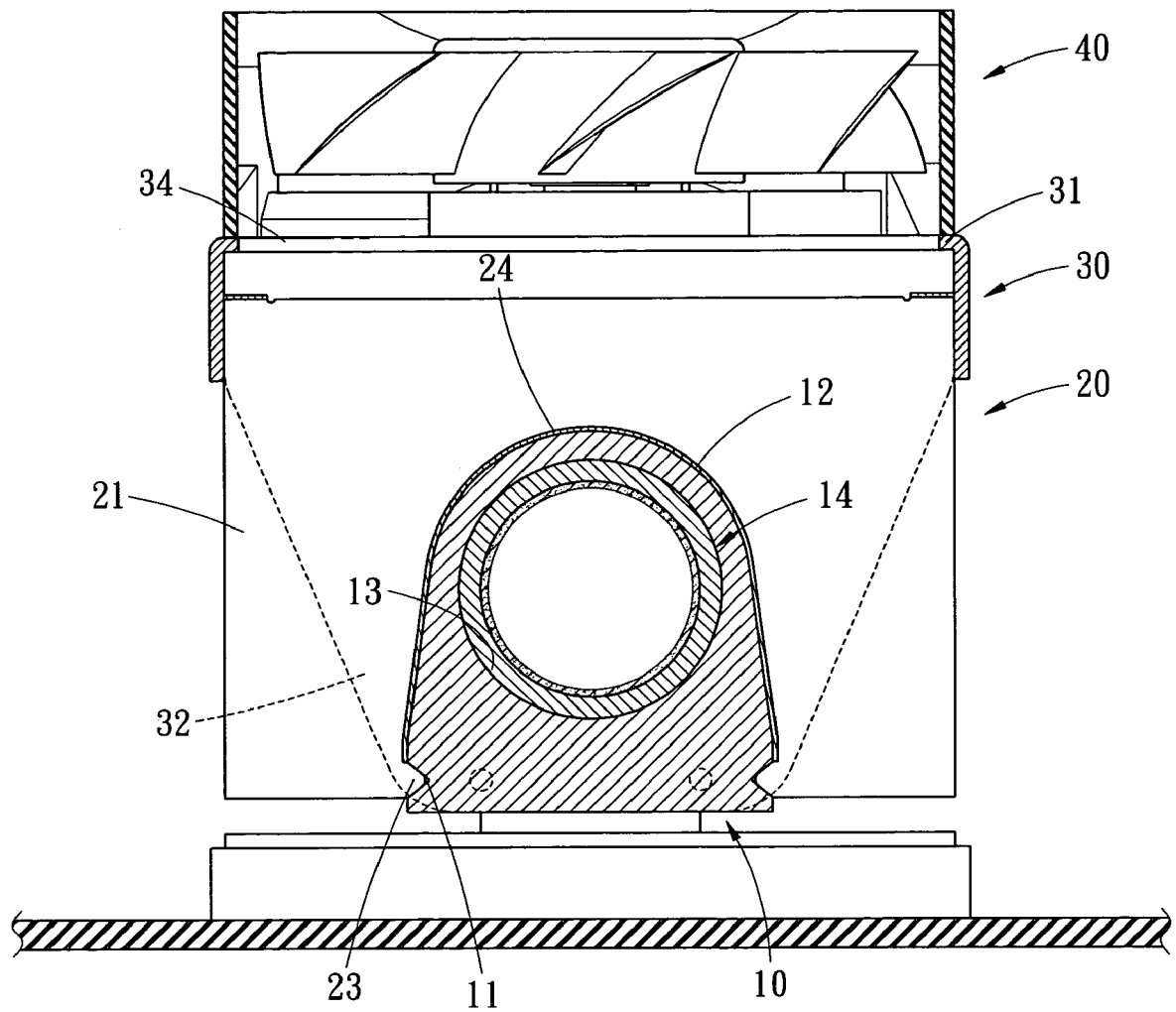
Figure 6:
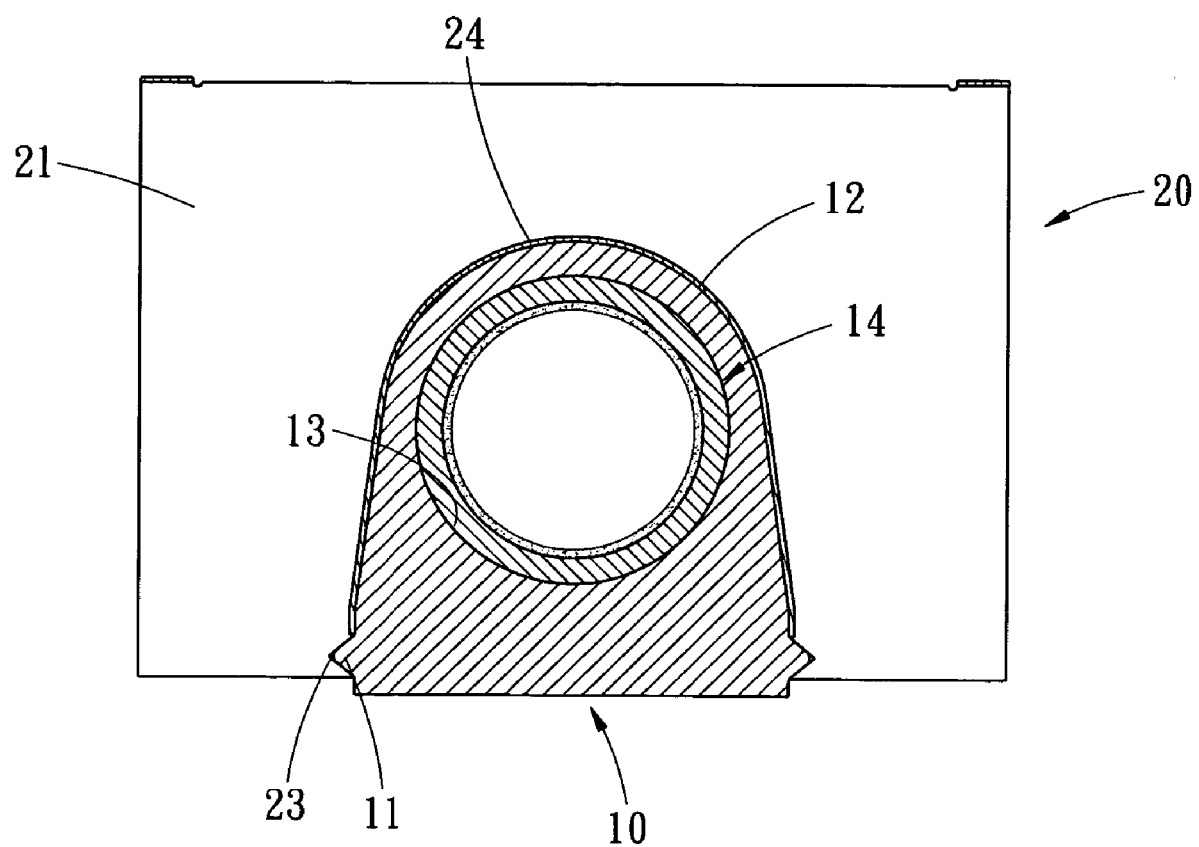
Figure 7:
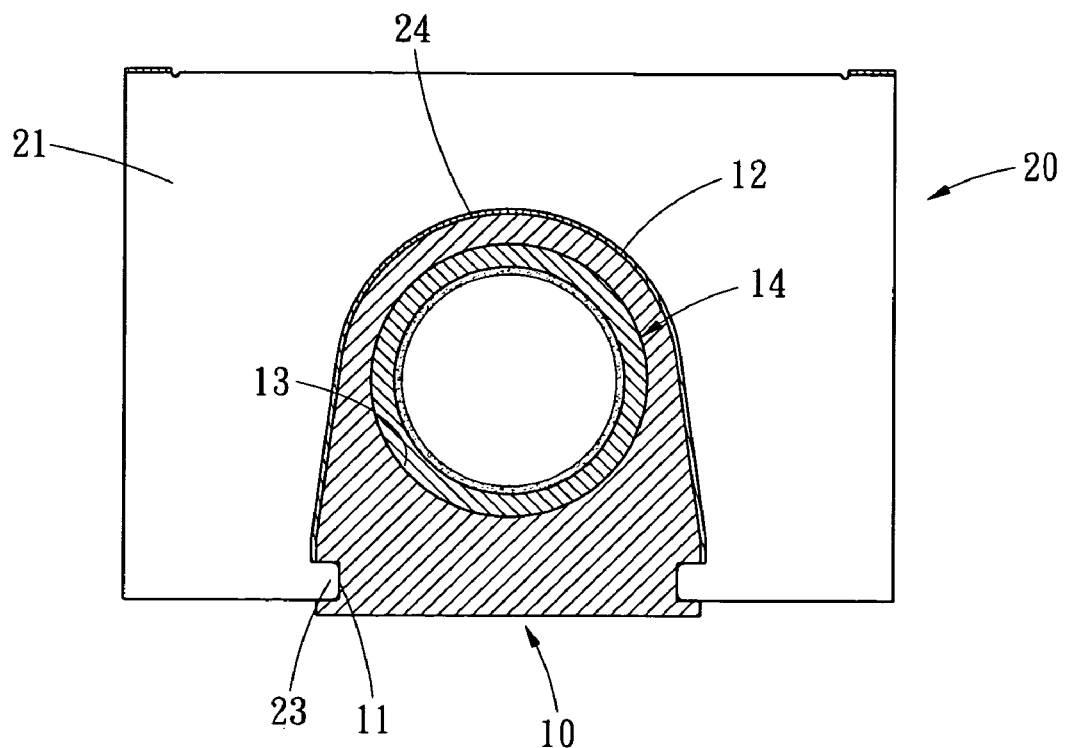
Figure 8:
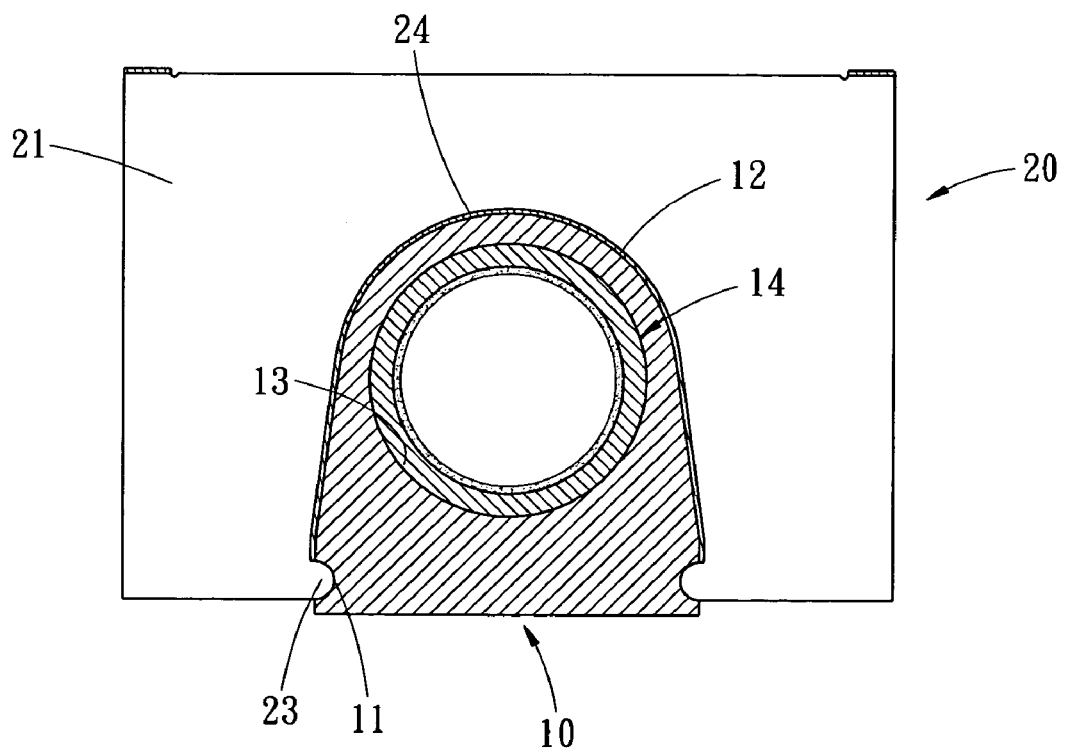
Figure 9:
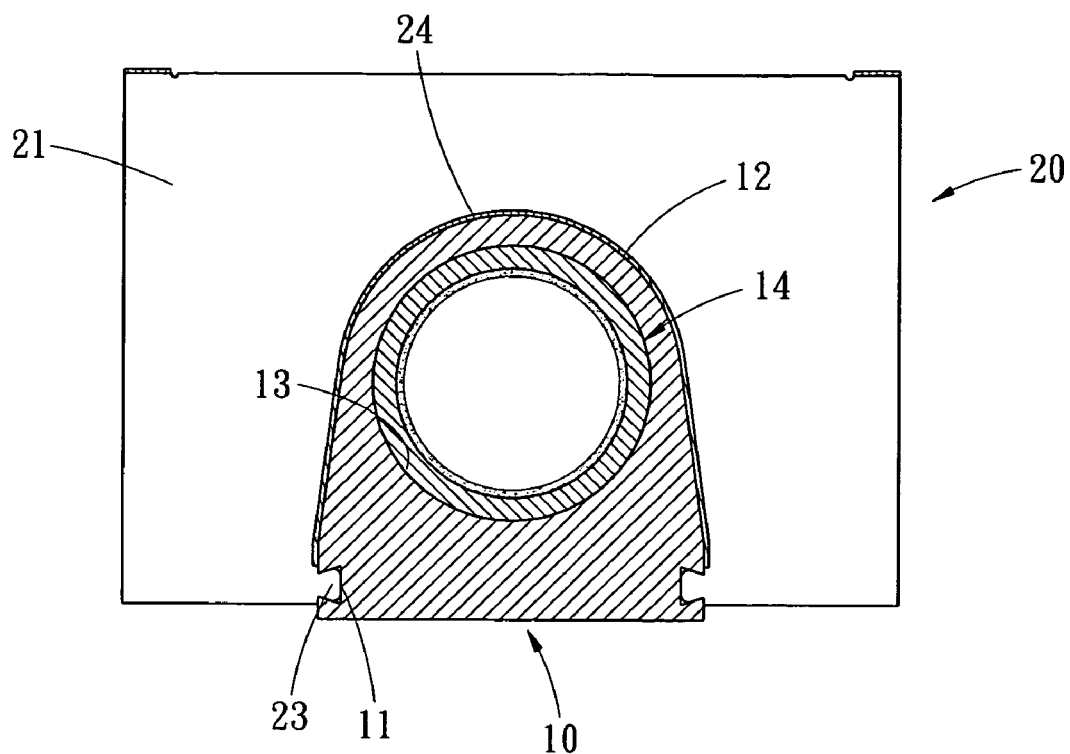
Figure 10:
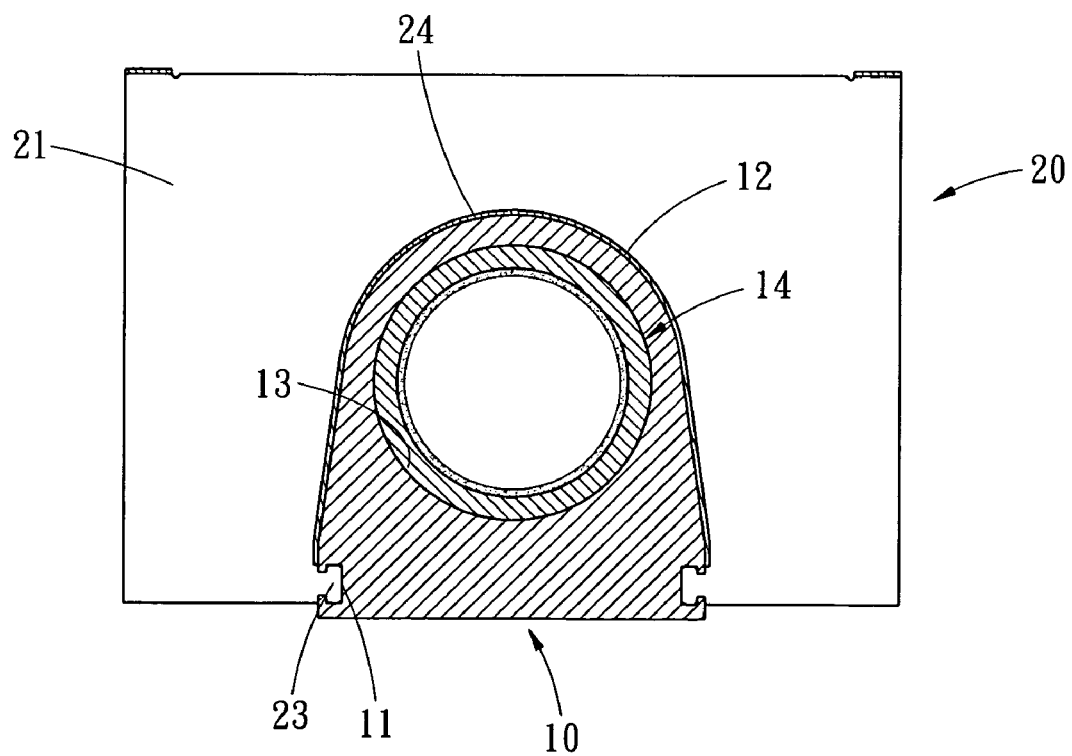

FIG. 5 a cross sectional view of the assembly of the system as shown in FIG. 4;

FIG. 6 is a cross sectional view of a heat dissipation apparatus in a second embodiment of the present invention;

FIG. 7 is a cross sectional view of a heat dissipation apparatus in a third embodiment of the present invention;

FIG. 8 is a cross sectional view of a heat dissipation apparatus in a fourth embodiment of the present invention;

FIG. 9 is a cross sectional view of a heat dissipation apparatus in a fifth embodiment of the present invention; and FIG. 10 is a cross sectional view of a heat dissipation apparatus in a second embodiment of the present invention.

DETAILED DESCRIPTION OF EMBODIMENT

Reference will now be made in detail to the preferred embodiments of the present invention, examples of which are illustrated in the accompanying drawings. Wherever possible, the same reference numbers are used in the drawings and the description to refer to the same or like parts.

Figure 1:
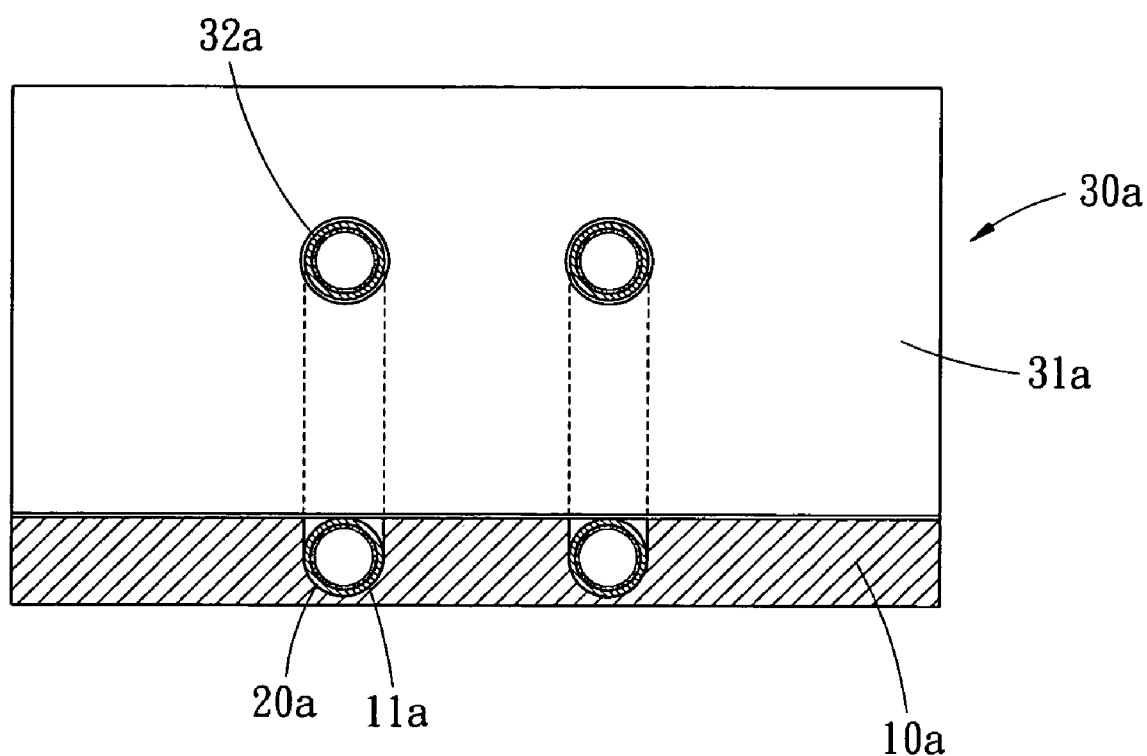
FIG. 1 illustrates a conventional heat dissipation apparatus.
Figure 2:
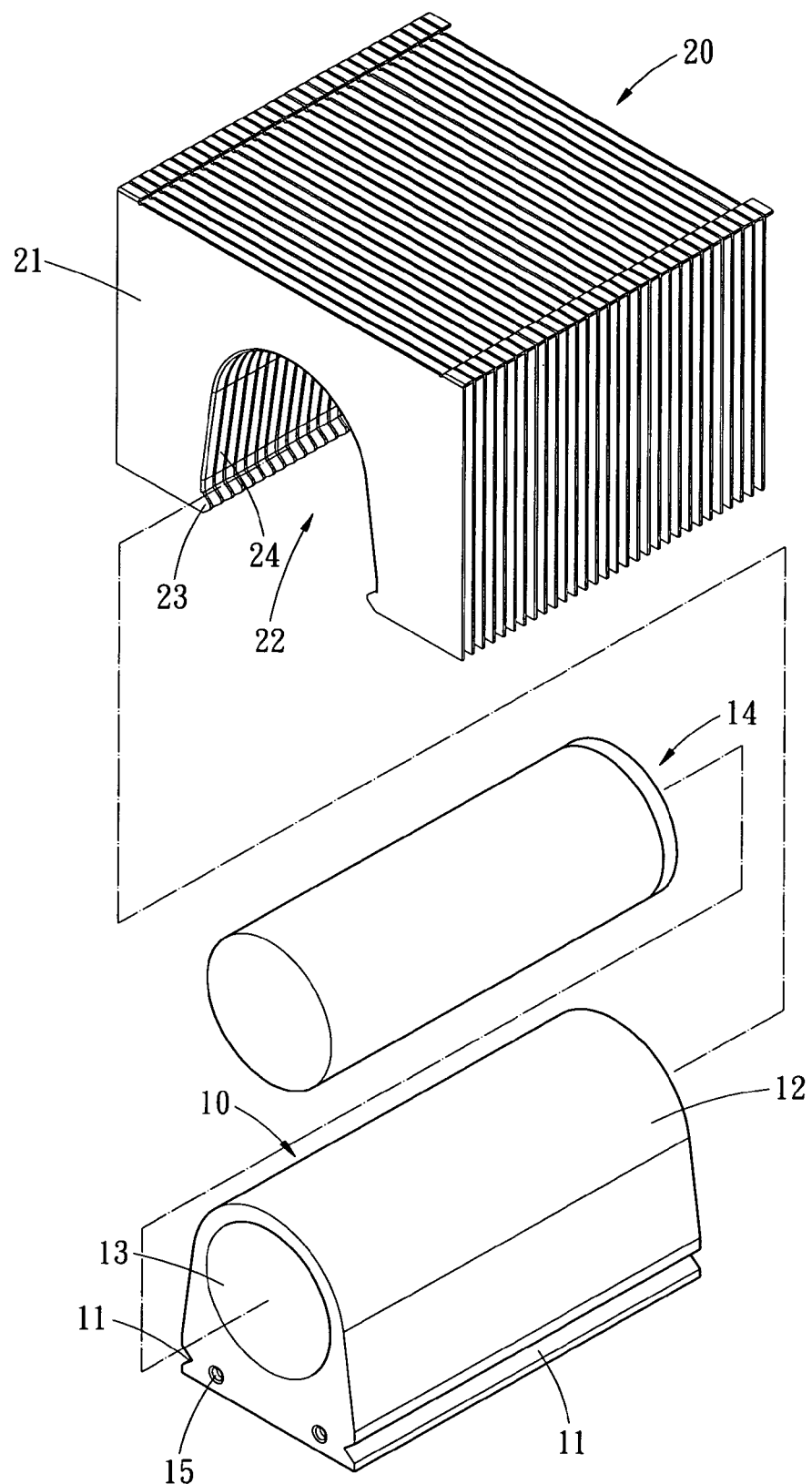
FIG. 2 shows an exploded view of a heat dissipation apparatus in a first embodiment of the present invention.
Figure 3:
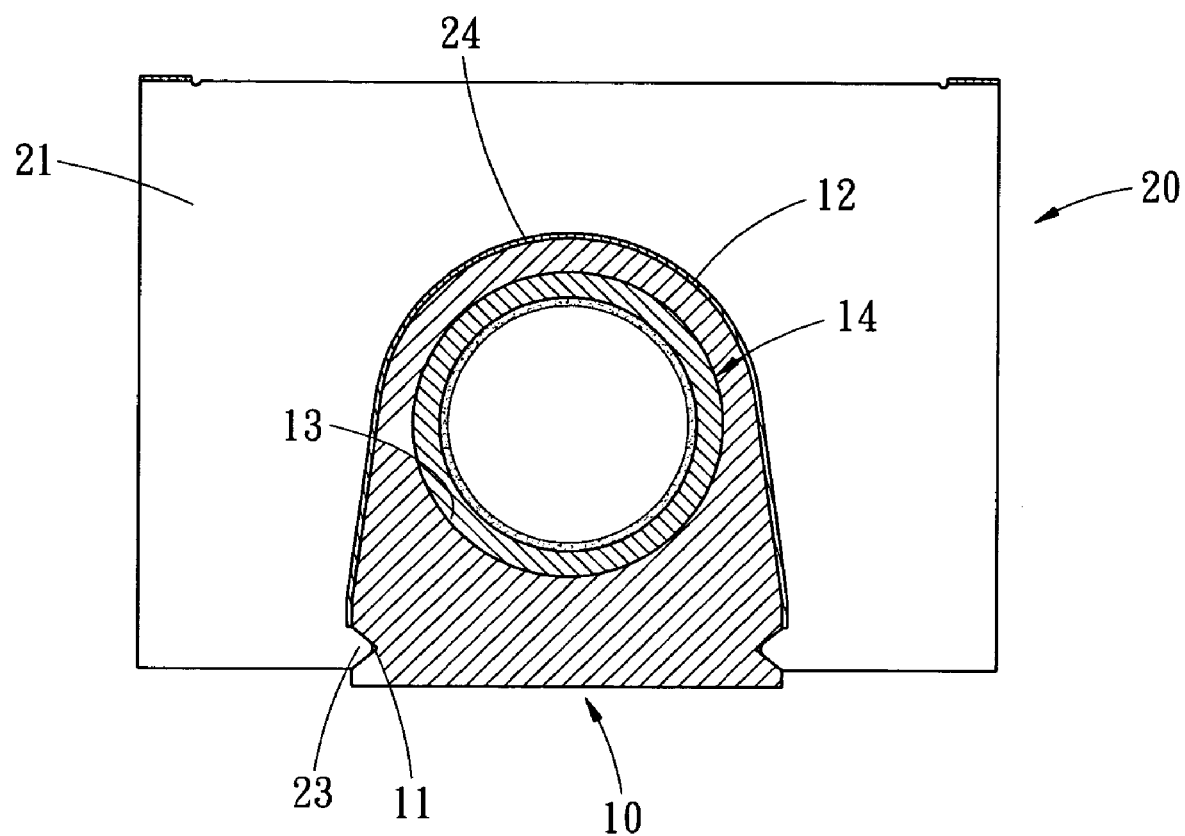
FIG. 3 shows a cross sectional view of a heat dissipation apparatus as shown in FIG. 2.

FIGS. 2 and 3 show an exploded view and a cross-sectional view of a heat dissipation apparatus that includes a thermal conductive base 10 and a heat sink 20 interlocked with each other.

The thermal conductor base 10 is fabricated from good thermal conductive material such as aluminum or copper, for example. In this embodiment, the thermal conductor base 10 includes two recessed grooves 11 extending through two opposing sides along an elongate direction of thereof. Preferably, the grooves 11 are form proximal to a bottom surface of the thermal conductor base 10. In this embodiment, the grooves 11 have a V-shape cross-section. The upper portion of the thermal conductor base 10 defines an arched cross-section serving as a contact portion 12. A channel 13 is formed to extend through the contact portion 12 along the elongate direction of the thermal conductor base 1. A heat pipe 14 with an external perimeter equal to the perimeter of the channel 13 can thus extend through the thermal conductor base 10. Wick structure and working fluid are installed in the heat pipe 14 to instantly dissipate heat-generated form a heat source. Before inserting the heat pipe 14 into the channel 13, thermal conductive medium or adhesive such as heat dissipation paste, lead, tin, or alloy of lead and tin metal or thermal conductive paste having low-fusion temperature can be applied on the periphery of the channel 13 and the side surface of the heat pipe 14.

The heat sink 20 is preferably fabricated from good thermal conductive material such as aluminum or copper. As shown, the heat sink 20 includes a plurality of fins 21 stacked together. The bottom surface of the heat sink 20 is recessed to form an arched opening serving as a receiving slot 22 of the contact portion 12 of the thermal conductor base 10. The bottom edge of the receiving slot 22 is in the form of barbs 23 to interlock with the grooves 11. Therefore, when the contact portion 12 is disposed within the receiving slot 22, the barbs 23 are snapped within the grooves 11, such that the heat sink 20 is secured to the thermal conductor base 10. A pad 24 is formed to extend over the surface of the receiving slot 22, such that the contact area between the heat sink 20 and thermal conductor base 10. The thermal conductive medium can thus be applied between the pad 24 and the exterior surface of the contact portion 12.

The heap pipe 14 can be inserted into the channel 13 before the heat sink 20 is interlocked with the thermal conductor base 10; or alternatively, the heat pipe 14 can be inserted into the channel 13 after the heat sink 20 and the thermal conductor base 10 are engaged with each other.

FIGS. 4 and 5 shows an assembly of the heat dissipation apparatus as shown in FIGS. 2 and 3, a fan holder 30 and a fan 40. As shown, the fan holder 30 is mounted on the heat sink 20 for mounting the fan 40. The holder 30 includes a main frame 31 disposed on the top surface of the heat sink 20 and a plurality of side plates 32 extending downwardly each side of the main frame 31. In this embodiment, the heat sink 20 has a rectangular top surface; and consequently, the main frame 31 has a rectangular geometry with four perpendicular sides. The side plates 32 may be formed integrally with the main frame 31 and extend perpendicularly thereto; or alternatively, the side plates 32 may be hinged with the sides of the main frame 31. As shown, a pair of the side plate 32 extends towards the bottom edges of the heat sink 20, and this pair of side plates 32 each includes at least one through hole 33. This pair of side plates 32 is positioned at two opposing ends of the channel 13. By forming a plurality of threaded holes 15 in the thermal conductor base 10 and aligning the holes 33 with the threaded holes 15, this pair of side plates 32 can be secured to two opposing ends of the thermal conductor base 10 by at least a pair of fastening members such screws. The main frame 31 has a circular hole 34 and a plurality of holes 35. The fan 30 also includes a plurality of holes 41 corresponding to the holes 35. Therefore, the fan 30 can be attached to the main frame 31 by a plurality of fastening members such as screws extending through the holes 41 and 35.

Referring to FIGS. 7 to 10, various modifications of the heat dissipation apparatus are illustrated. In FIG. 7, the grooves 11 have a rectangular cross section, while the bottom edges of the receiving slot 22 includes two elongate protrusions 23 having a rectangular cross section. In FIG. 8, the cross sections of the protrusions 23 and the grooves 11 are semi-circular; and in FIG. 9, the cross sections of the protrusions 23 and the grooves 11 are dovetailed. In FIG. 10, the cross sections of the protrusions 23 and the grooves 11 have T shaped. Preferably, the thermal conductive base 1 is slide in and out of the channel 13.

Accordingly, the integrated heat dissipation apparatus has at least the following advantages. The contact potion of the thermal conductive base and the receiving slot are in close configuration, such that the thermal conductive medium or paste is easily applied on the thermal conductive base and the receiving slot. The contact is improved,and the thermal resistance is reduced. The grooves and the protrusions mechanically interlock the thermal conductor base with the heat sink without any thermal or stress process, such that the heat sink is prevented from being deformed during assembly. The contact density between the thermal conductor and the heat sink is improved, and the thermal resistance is further reduced. The contact between the thermal conductor base and the heat sink provides streamline configuration for air circulation, such that air circulated within the heat sink is smoother, the flow resistance is reduced, and the noise is reduced. Further, as the sidewall of the heat pipe is formed of a very thin plate extremely vulnerable to impact or pressure subject thereto. The method of installing the heat pipe into the thermal conductor base provided by the present invention prevents the heat pipe from being recessed or deformed by external force.

While the present invention has been particularly shown and described with reference to preferred embodiments thereof, it will be understood by those of ordinary skill in the art the various changes in form and details may be made therein without departing from the spirit and scope of the present invention as defined by the appended claims.

What is claimed is:

1. An integrated heat dissipation apparatus, comprising:
   a thermal conductor base, including a channel formed in an upper portion thereof and a pair of grooves formed on two opposing elongate sidewalls thereof, wherein the channel extends through the thermal conductor base along an elongate direction thereof, and the grooves extend between two opposing ends of the thermal conductor base and are proximal to bottom edges of the sidewalls; and
   a heat sink, having a bottom surface recessed to form a receiving slot conformal to the upper portion of the thermal conductor base, wherein the receiving slot includes a pair of protrusions extending along two elongate bottom edges of the receiving slot between two opposing ends of the heat sink.

2. The apparatus as claimed in claim 1, wherein the grooves and the protrusions are engaged with each other.

3. The apparatus as claimed in claim 1, further comprising a thermal conductive medium applied on an external surface of the upper portion of the thermal conductor base and a sidewall of the receiving slot.

4. The apparatus as claimed in claim 3, wherein the thermal conductive medium includes heat dissipation paste, lead, tin, alloy of lead and tin, or a thermal conductive paste with low-fusion temperature.

5. The apparatus as claimed in claim 1, wherein the grooves have a cross section conform to a cross section of the protrusions.

6. The apparatus as claimed in claim 1, wherein the cross section of the grooves and the protrusions is V-shaped, rectangular shaped or semi-circular shaped.

7. The apparatus as claimed in claim 1, wherein the cross section of the grooves and the protrusions is dovetailed or T-shaped.

8. The apparatus as claimed in claim 1, wherein the channel includes a cylindrical channel allowing a heat pipe to slide therein.

9. The apparatus as claimed in claim 1, wherein the heat sink includes a plurality of fins stacked with each other.

10. The apparatus as claimed in claim 1, further comprising a pad disposed along the sidewall of the receiving slot.

11. The apparatus as claimed in claim 1, further comprising a holder mounted on the heat sink and a fan mounted to the holder.

12. The apparatus as claimed in claim 11, wherein the holder includes at least one pair of side plates disposed at two opposing ends of the channel.

13. The apparatus as claimed in claim 12, wherein the side plates are fastened to two opposing ends of the lower portion of the thermal conductor base.

* * * * *